(12) United States Patent
Chen et al.

(10) Patent No.: US 12,720,846 B2
(45) Date of Patent: Aug. 25, 2026

(54) SEMICONDUCTOR DEVICE WITH SUPPORTING STRUCTURES AND METHOD FOR FORMING THE SAME

(71) Applicant: TAIWAN SEMICONDUCTOR MANUFACTURING COMPANY LTD., Hsinchu (TW)

(72) Inventors: Yi-Huan Chen, Hsinchu City (TW); Chien-Chih Chou, New Taipei City (TW); Yu-Chang Jong, Hsinchu City (TW); Jhu-Min Song, Nantou County (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 758 days.

(21) Appl. No.: 17/818,285

(22) Filed: Aug. 8, 2022

(65) Prior Publication Data

US 2024/0047549 A1 Feb. 8, 2024

(51) Int. Cl.
*H10D 64/66* (2025.01)
*H10D 64/01* (2025.01)

(52) U.S. Cl.
CPC ..... *H10D 64/671* (2025.01); *H10D 64/01326* (2026.01); *H10D 64/021* (2025.01)

(58) Field of Classification Search
CPC ............... H10D 64/021; H10D 64/671; H10D 64/514–519; H01L 21/28123–2815
See application file for complete search history.

(56) References Cited

U.S. PATENT DOCUMENTS 6,348,387 B1 * 2/2002 Yu ...................... H10D 30/0212 257/E29.264
6,399,451 B1 * 6/2002 Lim .................... H10D 64/258 438/303

(Continued)

FOREIGN PATENT DOCUMENTS

CN 114530371 A * 5/2022

OTHER PUBLICATIONS

Virani et. al; “Double Dielectric Spacer for the Enhancement of Silicon p-Channel Tunnel Field Effect Transistor Performance”; 2011 Jpn. J. Appl. Phys. 50 04DC04; https://iopscience.iop.org/article/10.1143/JJAP.50.04DC04/pdf (Year: 2011).*

*Primary Examiner* — Britt Hanley
*Assistant Examiner* — Jason James Greaving
(74) *Attorney, Agent, or Firm* — WPAT LAW; Anthony King

(57) ABSTRACT

A semiconductor device and a method for manufacturing the semiconductor device are provided. The semiconductor device comprises an insulating structure, a dielectric structure, a metal structure, a conductive spacer and a dielectric spacer. The dielectric structure is formed on the insulating structure. The metal structure is formed on and surrounded by the dielectric structure. A bottom surface and a lateral surface of the metal structure are in direct contact with the dielectric structure. The conductive spacer is formed on the insulating structure. The conductive spacer surrounds the dielectric structure. The dielectric spacer is formed on the insulating structure, wherein the dielectric spacer surrounds the conductive spacer.

20 Claims, 16 Drawing Sheets

(56) References Cited

U.S. PATENT DOCUMENTS

| | | | | |
|---|---|---|---|---|
| 2006/0237780 | A1 * | 10/2006 | Loechelt | H01L 21/2815 257/330 |
| 2007/0200185 | A1 * | 8/2007 | Hirase | H10D 64/671 257/E29.152 |
| 2014/0369115 | A1 * | 12/2014 | Kim | H10D 30/6211 365/182 |
| 2017/0011925 | A1 * | 1/2017 | Liao | H10D 64/514 |
| 2017/0110536 | A1 * | 4/2017 | Hsiao | H01L 23/535 |
| 2018/0012967 | A1 * | 1/2018 | Kang | H10D 84/856 |
| 2020/0027964 | A1 * | 1/2020 | Cheng | H10D 30/023 |
| 2021/0242324 | A1 * | 8/2021 | Yao | H10D 64/017 |
| 2023/0039627 | A1 * | 2/2023 | Kao | H10D 84/85 |

* cited by examiner

SEMICONDUCTOR DEVICE WITH SUPPORTING STRUCTURES AND METHOD FOR FORMING THE SAME

BACKGROUND

The present disclosure relates, in general, to semiconductor devices and methods for manufacturing the same. Specifically, the present disclosure relates to semiconductor devices with supporting structures and methods for manufacturing the same.

Semiconductor devices have been widely used for various applications, such as display driver IC. However, leakage current may affect the performance of the semiconductor device. Additionally, the processing integration could become difficult during the manufacturing process of the semiconductor device.

BRIEF DESCRIPTION OF THE DRAWINGS

Aspects of the embodiments of the present disclosure are best understood from the following detailed description when read with the accompanying figures. It should be noted that, in accordance with standard practice in the industry, various structures are not drawn to scale. In fact, the dimensions of the various structures can be arbitrarily increased or reduced for clarity of discussion.

DETAILED DESCRIPTION

Figure 1A:
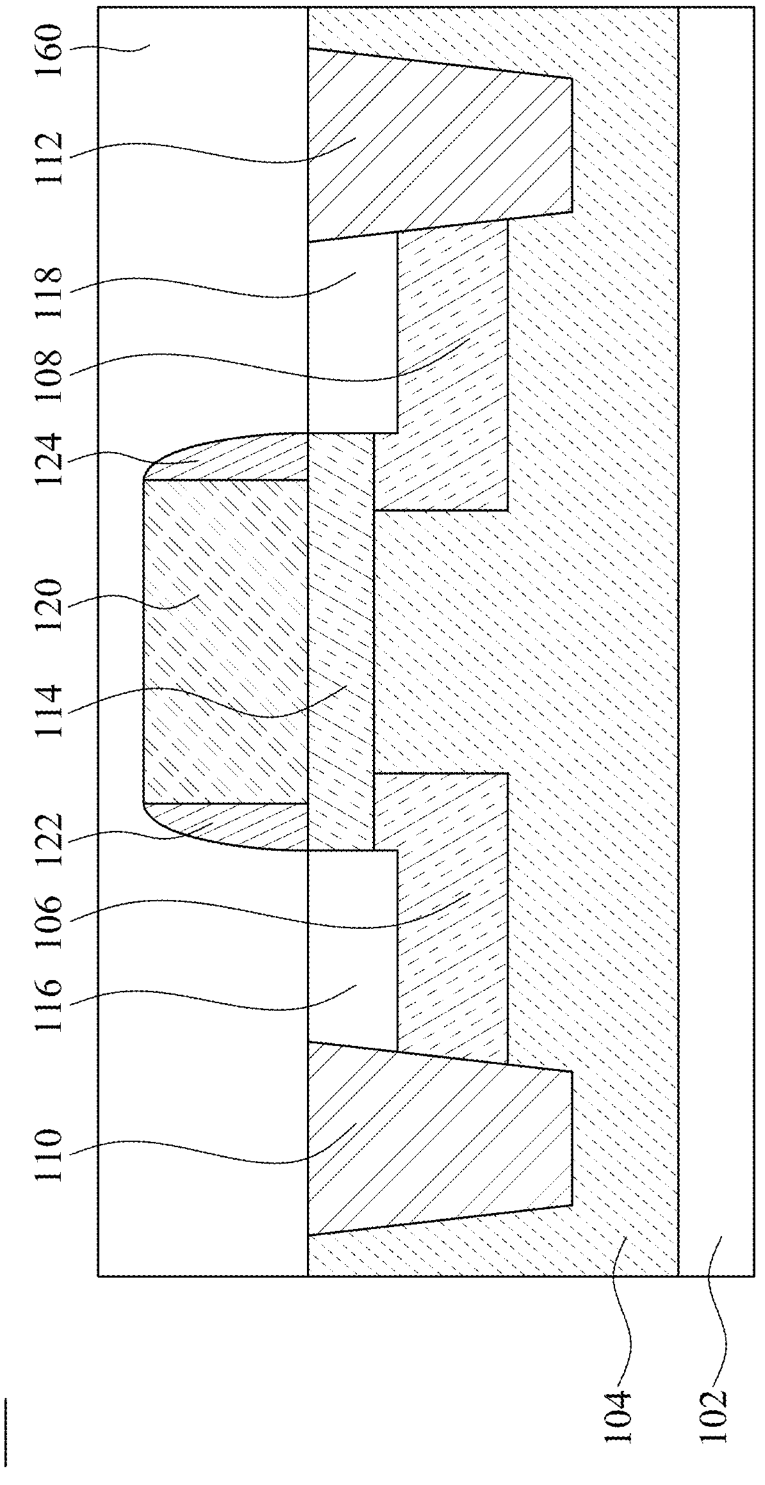
FIG. 1A is a schematic view illustrating a cross-section of a semiconductor device, in accordance with some embodiments of the present disclosure.

The following disclosure provides many different embodiments, or examples, for implementing different features of the provided subject matter. Specific examples of elements and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features can be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as “beneath,” “below,” “lower,” “above,” “over,” “upper,” “on” and the like, can be used herein for ease of description to describe one element or feature’s relationship to another element(s) or feature(s) as illustrated in the figures. The spatially relative terms are intended to encompass different orientations of the device in use or operation in addition to the orientation depicted in the figures. The apparatus can be otherwise oriented (rotated 90 degrees or at other orientations) and the spatially relative descriptors used herein may likewise be interpreted accordingly.

As used herein, although terms such as “first,” “second” and “third” describe various elements, components, regions, layers and/or sections, these elements, components, regions, layers and/or sections should not be limited by these terms. These terms may only be used to distinguish one element, component, region, layer or section from another. Terms such as “first,” “second” and “third” when used herein do not imply a sequence or order unless clearly indicated by the context.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the terms “substantially,” “approximately” and “about” generally mean within a value or range that can be contemplated by people having ordinary skill in the art. Alternatively, the terms “substantially,” “approximately” and “about” mean within an acceptable standard error of the mean when considered by one of ordinary skill in the art. People having ordinary skill in the art can understand that the acceptable standard error may vary according to different technologies.

Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the terms "substantially," "approximately" or "about." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as from one endpoint to another endpoint or between two endpoints. All ranges disclosed herein are inclusive of the endpoints, unless specified otherwise.

FIG. 1A is a schematic view illustrating a cross-section of a semiconductor device 10A, in accordance with some embodiments of the present disclosure. The semiconductor device 10A may include a substrate 102, a doped region 104, lightly doped regions 106 and 108, isolation regions 110 and 112, an insulating structure 114, source/drain regions 116 and 118, a metal structure 120, dielectric spacers 122 and 124, and a passivation layer 160.

The substrate 102 may include a semiconductor substrate. In some embodiments, the substrate 102 may include, for example, silicon (Si), monocrystalline silicon, polysilicon, amorphous silicon, germanium (Ge), silicon germanium (SiGe), silicon carbide (SiC), silicon germanium carbide (SiGeC), gallium (Ga), gallium arsenide (GaAs), indium (In), indium arsenide (InAs), indium phosphide (InP) or other IV-IV, III-V or II-VI semiconductor materials. In some other embodiments, the substrate 102 may include a layered semiconductor such as silicon/silicon germanium, silicon-on-insulator, or silicon germanium-on-insulator.

The doped region 104 may be formed on the substrate 102. The doped region 104 may be doped with an N-type dopant such as phosphorus (P), arsenic (As), or antimony (Sb). In some other embodiments, the doped region 104 may be doped with a P-type dopant such as boron (B) or indium (In). In some embodiments, the substrate 102 may be or include an unimplanted area. In some embodiments, the doped region 104 may have a higher doping concentration than the substrate 102.

In some embodiments, the doped region 104 may include a substantially constant doping concentration. In some embodiments, the doped region 104 may include a step, gradient, or other doping profile. For example, the doped region 104 may include a gradually changing doping concentration.

The lightly doped regions 106 and 108 may be formed within the doped region 104. The lightly doped regions 106 and 108 may be surrounded by the doped region 104. In some embodiments, the lightly doped regions 106 and 108 may have a lower doping concentration than the doped region 104. The lightly doped regions 106 and 108 could include lightly doped drain (LDD).

The lightly doped regions 106 and 108 may be doped with an N-type dopant such as phosphorus (P), arsenic (As), or antimony (Sb). In some other embodiments, the doped region 104 may be doped with a P-type dopant such as boron (B) or indium (In). In some embodiments, the lightly doped regions 106 and 108 may include a substantially constant doping concentration. In some embodiments, the lightly doped regions 106 and 108 may include a step, gradient, or other doping profile. For example, the lightly doped regions 106 and 108 may include a gradually changing doping concentration.

The isolation regions 110 and 112 may be formed within the doped region 104. The isolation regions 110 and 112 may be surrounded by the doped region 104 and the lightly doped regions 106 and 108. The isolation regions 110 and 112 may contact the doped region 104 and the lightly doped regions 106 and 108.

Each of the isolation regions 110 and 112 may include a shallow trench isolation (STI). The isolation regions 110 and 112 may be used for electrically isolating the semiconductor device 10A from another semiconductor device. The isolation regions 110 and 112 may be used for physically isolating the semiconductor device 10A from another semiconductor device.

In some embodiments, the isolation regions 110 and 112 may include, for example, silicon oxide ($SiO_2$), silicon nitride ($Si_3N_4$), silicon oxynitride, silicon nitride oxide, a high-k material or combinations thereof. Examples of the high-k material include a dielectric material having a dielectric constant higher than that of silicon dioxide ($SiO_2$), or a dielectric material having a dielectric constant higher than about 3.9. In some embodiments, the isolation regions 110 and 112 may include at least one metallic element, such as hafnium oxide ($HfO_2$), silicon doped hafnium oxide (HSO), lanthanum oxide ($La_2O_3$), lanthanum aluminum oxide ($LaAlO_3$), zirconium oxide ($ZrO_2$), zirconium orthosilicate ($ZrSiO_4$), aluminum oxide ($Al_2O_3$) or combinations thereof.

The source/drain regions 116 and 118 may be surrounded by the doped region 104. The source/drain regions 116 and 118 may be formed within at least a portion of the lightly doped regions 106 and 108. The source/drain regions 116 and 118 may contact at least a portion of the isolation regions 110 and 112.

In some embodiments, the source/drain regions 116 and 118 may have a different doping concentration than the lightly doped regions 106 and 108. In some embodiments, the source/drain regions 116 and 118 may have a higher doping concentration than the lightly doped regions 106 and 108. The source/drain regions 116 and 118 may refer to a source electrode or a drain electrode, individually or collectively dependent upon the context.

The source/drain regions 116 and 118 may be doped with an N-type dopant such as phosphorus (P), arsenic (As), or antimony (Sb). In some other embodiments, the doped region 104 may be doped with a P-type dopant such as boron (B) or indium (In). In some embodiments, the source/drain regions 116 and 118 may include a substantially constant doping concentration. In some embodiments, the source/drain regions 116 and 118 may include a step, gradient, or other doping profile. For example, the source/drain regions 116 and 118 may include a gradually changing doping concentration.

In some embodiments, the insulating structure 114 may be formed within the doped region 104. The insulating structure 114 may contact at least a portion of the lightly doped regions 106 and 108. The insulating structure 114 may be surrounded by the source/drain regions 116 and 118. The insulating structure 114 may be formed between the isolation regions 110 and 112.

In some embodiments, the insulating structure 114 may include local oxidation of silicon (LOCOS). In some embodiments, the insulating structure 114 may include a gate oxide (GOX) layer. In some embodiments, the insulating structure 114 may reduce the parasitic capacitor of the semiconductor device 10B. Therefore, the operation lag or the RC delay of the semiconductor device 10B could be improved.

In some embodiments, the insulating structure 114 may include, for example, silicon oxide ($SiO_2$), silicon nitride ($Si_3N_4$), silicon oxynitride, silicon nitride oxide, a high-k material or combinations thereof. In some embodiments, the insulating structure 114 may include at least one metallic element, such as hafnium oxide ($HfO_2$), silicon doped hafnium oxide (HSO), lanthanum oxide ($La_2O_3$), lanthanum aluminum oxide ($LaAlO_3$), zirconium oxide ($ZrO_2$), zirconium orthosilicate ($ZrSiO_4$), aluminum oxide ($Al_2O_3$) or combinations thereof.

The metal structure 120 may be formed on the insulating structure 114. The metal structure 120 may be in direct contact with the insulating structure 114. The metal structure 120 may be a gate electrode or a gate structure. The metal structure 120 may include a conductive material. The metal structure 120 may include a metal. The metal structure 120 may include, for example, but are not limited to, Al, Ti, AlN, TiN or a metal compound.

The dielectric spacers 122 and 124 may be formed on the insulating structure 114. The dielectric spacers 122 and 124 may be in direct contact with the insulating structure 114. The metal structure 120 may be formed between the dielectric spacers 122 and 124. The metal structure 120 may be surrounded by the dielectric spacers 122 and 124. The dielectric spacers 122 and 124 may include silicon nitride ($Si_3N_4$), silicon oxynitride, silicon nitride oxide, etc.

The passivation layer 160 is disposed on at least a portion of the doping region 104, the isolation regions 110 and 112, and the source-drain regions 116 and 118. In some embodiments, the passivation layer 160 covers the metal structure 120 and the dielectric spacers 112 and 124. The metal structure 120 and the dielectric spacers 112 and 124 may be compassed or encircled by the passivation layer 160. In some embodiments, the passivation layer 160 may include silicon oxide, silicon nitride, gallium oxide, aluminum oxide, scandium oxide, zirconium oxide, lanthanum oxide or hafnium oxide.

Figure 1B:
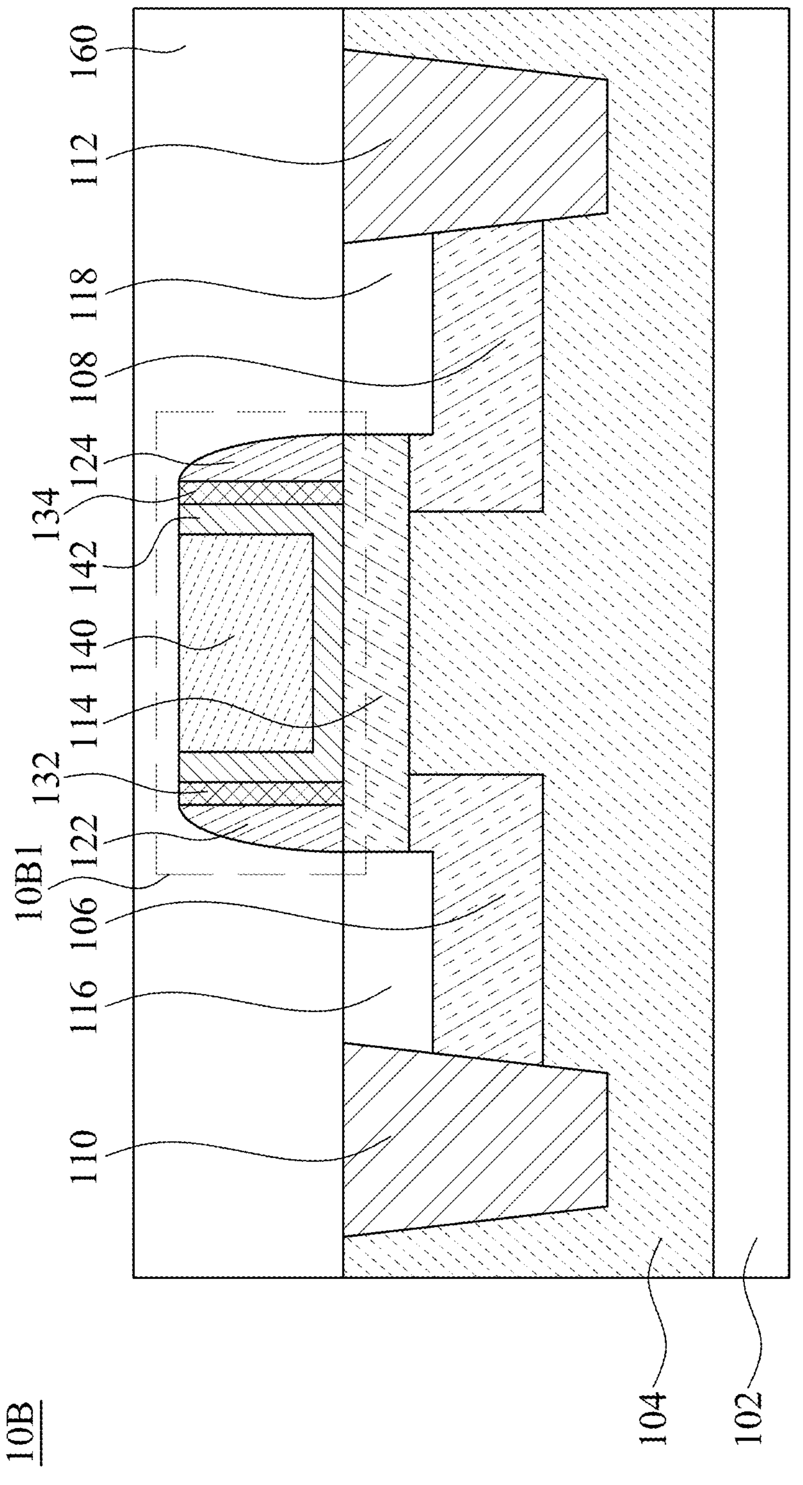
FIG. 1B is another schematic view illustrating a cross-section of a semiconductor device, in accordance with some embodiments of the present disclosure.

FIG. 1B is another schematic view illustrating a cross-section of a semiconductor device 10B, in accordance with some embodiments of the present disclosure. The semiconductor device 10B of FIG. 1B may be similar to the semiconductor device 10A of FIG. 1A except the dotted box 10B 1 as illustrated in FIG. 1B.

Figure 1C:
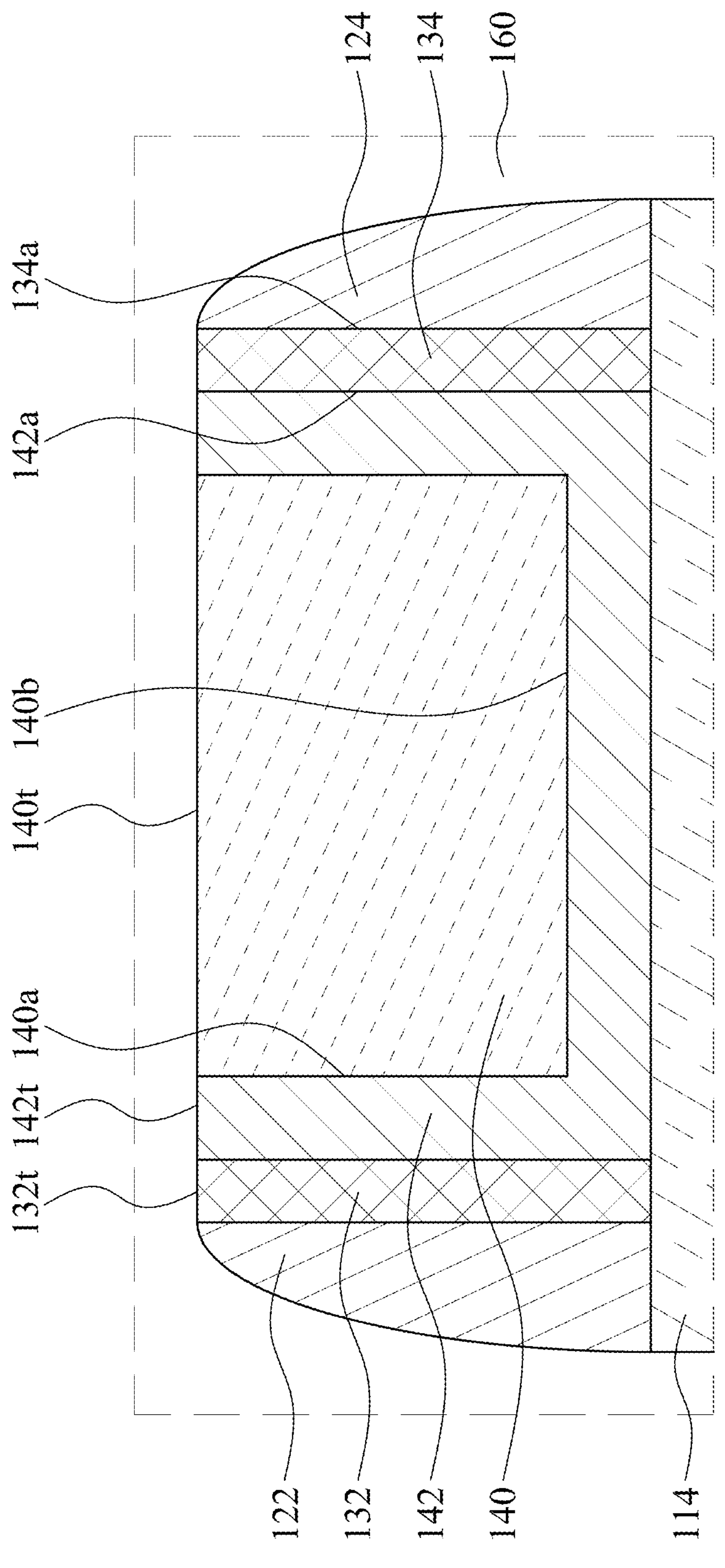
FIG. 1C is a schematic view illustrating a dotted box of the cross-section of the semiconductor device of FIG. 1B, in accordance with some embodiments of the present disclosure.

FIG. 1C is a schematic view illustrating a dotted box 10B 1 of the cross-section of the semiconductor device of FIG. 1B, in accordance with some embodiments of the present disclosure. In some embodiments, the dotted box 10B 1 of the semiconductor device 10B may include the metal structure 140, the dielectric structure 142, the conductive spacers 132 and 134, and the dielectric spacers 122 and 124.

The metal structure 140 may be formed above the insulating structure 114. The metal structure 140 may be formed on the dielectric structure 142. The metal structure 140 may not be in direct contact with the insulating structure 114. The metal structure 140 may be in direct contact with the dielectric structure 142. The metal structure 140 may be a gate electrode or a gate structure. The metal structure 140 may include a conductive material. The metal structure 140 may include a metal. The metal structure 140 may include, for example, but are not limited to, Al, Ti, AlN, TiN or a metal compound.

The dielectric structure 142 may include, for example, silicon oxide ($SiO_2$), silicon nitride ($Si_3N_4$), silicon oxynitride, silicon nitride oxide, a high-k material or combinations thereof. Examples of the high-k material include a dielectric material having a dielectric constant higher than that of silicon dioxide ($SiO_2$), or a dielectric material having a dielectric constant higher than about 3.9. In some embodiments, the dielectric structure 142 may include at least one metallic element, such as hafnium oxide ($HfO_2$), silicon doped hafnium oxide (HSO), lanthanum oxide ($La_2O_3$), lanthanum aluminum oxide ($LaAlO_3$), zirconium oxide ($ZrO_2$), zirconium orthosilicate ($ZrSiO_4$), aluminum oxide ($Al_2O_3$) or combinations thereof.

In some embodiments, the dielectric structure 142 may be in the configuration of a U shape including a bottom portion and two side portions. In some embodiments, the metal structure 140 may be compassed or surrounded by the dielectric structure 142. The metal structure 140 may be in direct contact with the dielectric structure 142. The lateral surface 140*a* of the metal structure 140 may be in direct contact with the side portion of the dielectric structure 142. The bottom surface 140*b* of the metal structure 140 may be in direct contact with the bottom portion of the dielectric structure 142.

In some embodiments, the metal structure 140 may be uncovered by the dielectric structure 142. The top surface 140*t* of the metal structure 140 may not be in direct contact with the dielectric structure 142. The metal structure 140 may be exposed from the dielectric structure 142. The top surface 140*t* of the metal structure 140 may be coplanar with the top surface 142*t* of the dielectric structure 142.

The conductive spacers 132 and 134 may be formed on the insulating structure 114. The conductive spacers 132 and 134 may include, for example, silicon (Si), monocrystalline silicon, polysilicon, amorphous silicon, germanium (Ge), silicon germanium (SiGe), silicon carbide (SiC), silicon germanium carbide (SiGeC), gallium (Ga), gallium arsenide (GaAs), indium (In), indium arsenide (InAs), indium phosphide (InP) or other IV-IV, III-V or II-VI semiconductor materials.

In some embodiments, the conductive spacers 132 and 134 may be in direct contact with the insulating structure 114. The bottom surfaces of the conductive spacers 132 and 134 may be in direct contact with the top surface of the insulating structure 114.

In some embodiments, the conductive spacers 132 and 134 may be in direct contact with the dielectric structure 142. The lateral surfaces of the conductive spacers 132 and 134 may be in direct contact with the lateral surface of the dielectric structure 142. The top surface 132*t* of the conductive spacer 132 may be coplanar with the top surface 142*t* of the dielectric structure 142 and the top surface 140*t* of the metal structure 140. The top surface of the conductive spacer 134 may be coplanar with the top surface 142*t* of the dielectric structure 142 and the top surface 140*t* of the metal structure 140.

The dielectric spacers 122 and 124 may be formed on the insulating structure 114. The dielectric spacers 122 and 124 may be in direct contact with the insulating structure 114. The dielectric spacers 122 and 124 may be in direct contact with the top surface of the insulating structure 114. The dielectric spacers 122 and 124 may be in direct contact with the lateral surfaces of the conductive spacers 132 and 134. The dielectric structure 142 may be formed between the dielectric spacers 122 and 124. The dielectric structure 142 may be surrounded by the dielectric spacers 122 and 124. The dielectric spacers 122 and 124 may include silicon nitride ($Si_3N_4$), silicon oxynitride, silicon nitride oxide, etc.

In some embodiments, the dielectric constant of the dielectric structure 142 may be greater than that of the conductive spacers 132 and 134. In some embodiments, the dielectric constant of the conductive spacers 132 and 134 may be greater than that of the dielectric spacers 122 and 124. For example, the dielectric constant of the dielectric structure 142 can be in the range of 25 to 40. The dielectric constant of the conductive spacers 132 and 134 can be in the range of 10 to 20. The dielectric constant of the dielectric spacers 122 and 124 can be in the range of 1 to 10.

In some embodiments, the width of the dielectric structure 142 may be smaller than that of the conductive spacers 132 and 134. In some embodiments, the width of the conductive spacers 132 and 134 may be greater than the average width of the dielectric spacers 122 and 124. For example, the width of the dielectric structure 142 can be in the range of 1 nm to 2 nm. The width of the conductive spacers 132 and 134 can be in the range of 50 nm to 200 nm. The average width of the dielectric spacers 122 and 124 can be in the range of 10 nm to 20 nm.

In some embodiments, composite spacer (including the dielectric structure 142, the conductive spacers 132 and 134, and the dielectric spacers 122 and 124) may be used for the semiconductor device of the present disclosure. In some embodiments, the composite spacer may be tunable by adjusting the width, size or material of the dielectric structure, the conductive spacers and the dielectric spacers. As a result, the distance between the gate structure and the source/drain region can be adjusted or reduced by the proposed composite spacer, and the leakage current could be decreased accordingly to improve the performance and reliability of the semiconductor device.

Figure 1D:
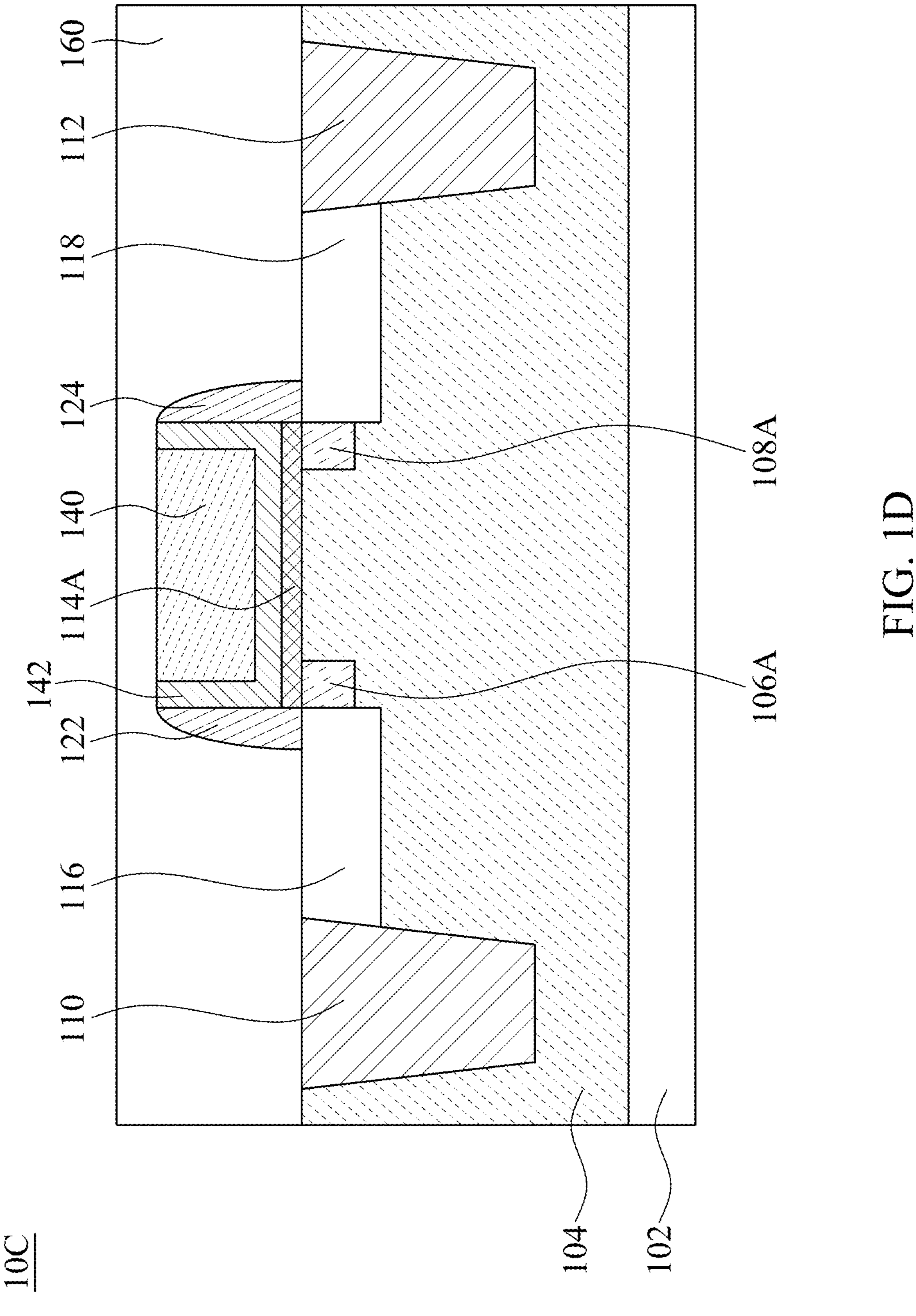
FIG. 1D is another schematic view illustrating a cross-section of a semiconductor device, in accordance with some embodiments of the present disclosure.

FIG. 1D is another schematic view illustrating a cross-section of a semiconductor device 10C, in accordance with some embodiments of the present disclosure. The semiconductor device 10C of FIG. 1D may be similar to the semiconductor device 10B of FIG. 1B, except for the differences described as follows.

The insulating structure 114A may be formed on the doped region 104. The insulating structure 114A may be uncovered by the doped region 104. The bottom surface of the insulating structure 114A may be in direct contact with the top surface of the doped region 104. The length of the insulating structure 114A may be substantially the same as that of the dielectric structure 142. The lateral surface of the insulating structure 114A may be coplanar with that of the dielectric structure 142. The thickness of the insulating structure 114A may be smaller than that of the insulating structure 114 of the semiconductor device 10B of FIG. 1B.

In some embodiments, the lightly doped regions 106A and 108A may be formed within the doped region 104. The lightly doped regions 106A and 108A may be surrounded by the doped region 104. In some embodiments, the lightly doped regions 106A and 108A may have a lower doping concentration than the doped region 104. The lightly doped regions 106 and 108 could include lightly doped drain (LDD).

The lightly doped regions 106A and 108A may contact the bottom surface of the insulating structure 114A. The lightly doped region 106A may contact the lateral surface of the doped region 116. The lightly doped region 108A may contact the lateral surface of the doped region 118. The lateral surface of the lightly doped region 106A may be coplanar with those of the dielectric structure 142 and the insulating structure 114A. The lateral surface of the lightly doped region 108A may be coplanar with those of the dielectric structure 142 and the insulating structure 114A. The area/volume of the lightly doped regions 106A and 108A may be smaller than that of the lightly doped regions 106 and 108 of the semiconductor device 10B of FIG. 1B.

Figure 1E:
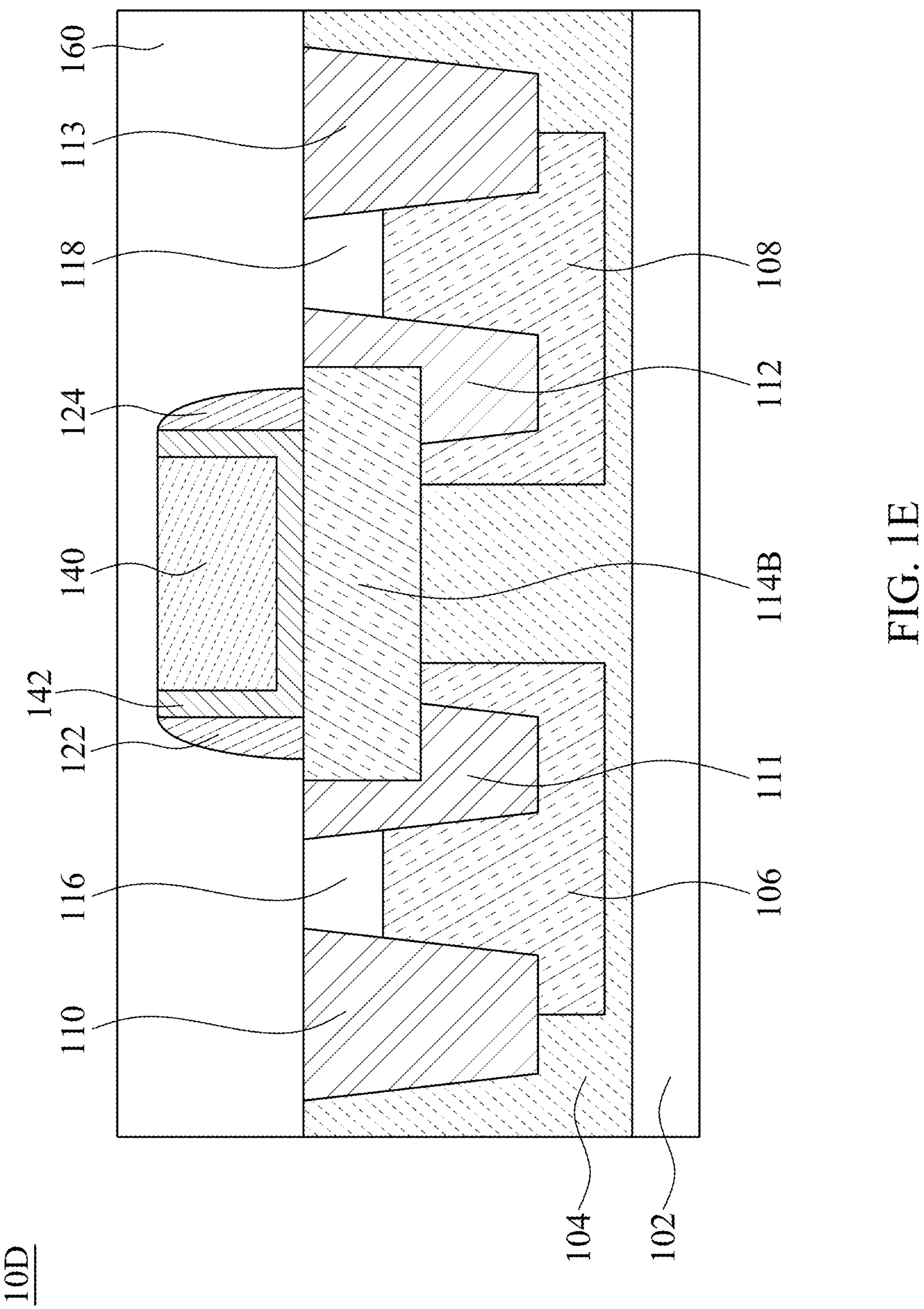
FIG. 1E is another schematic view illustrating a cross-section of a semiconductor device, in accordance with some embodiments of the present disclosure.

FIG. 1E is another schematic view illustrating a cross-section of a semiconductor device 10D, in accordance with some embodiments of the present disclosure. The semiconductor device 10D of FIG. 1E may be similar to the semiconductor device 10B of FIG. 1B, except for the differences described as follows.

In some embodiments, the area/volume of the insulating structure 114B may be greater than that of the insulating structure 114 of the semiconductor device 10B of FIG. 1B. A portion of the insulating structure 114B may be compassed or surrounded by the isolation regions 111 and 112. A portion of the top surface of the insulating structure 114B may be uncovered by the dielectric spacers 122 and 124.

In some embodiments, the source/drain region 116 may be formed between isolation regions 110 and 111. The lateral surfaces of the source/drain region 116 may contact portions of the lateral surfaces of the isolation regions 110 and 111. In some embodiments, the source/drain region 118 may be formed between isolation regions 112 and 113. The lateral surfaces of the source/drain region 118 may contact portions of the lateral surfaces of the isolation regions 112 and 113.

In some embodiments, the semiconductor devices 10A, 10B, 10C and 10D may be embedded within or included by a driver IC for a display device. The display device could be a projective display device, a 3D-image display device, an organic LED display, an electronic paper, a system-integrated panel, a LED display liquid-crystal panel, or a touch display panel such as resistive touch panel, capacitive touch panel, optical touch panel or electromagnetic touch panel.

In some embodiments, the semiconductor devices 10A and 10B may be used or applied for a middle voltage (MV) operations, such as source driving. The semiconductor devices 10C may be used or applied for a low voltage (LV) operations, such as memory buffer, timing generation, gamma adjustment and CPU interface. The semiconductor device 10D may be used or applied for a high voltage (HV) operations, such as gate driving and step-up circuit.

In some embodiments, the semiconductor device may be tunable by adjusting the width, size or material of the dielectric structure, the conductive spacers and the dielectric spacers. Therefore, the distance between the gate structure and the source/drain region can be adjusted or reduced by the proposed composite spacer, and the leakage current could be reduced accordingly to enhance the performance of the semiconductor device.

Figure 2A:
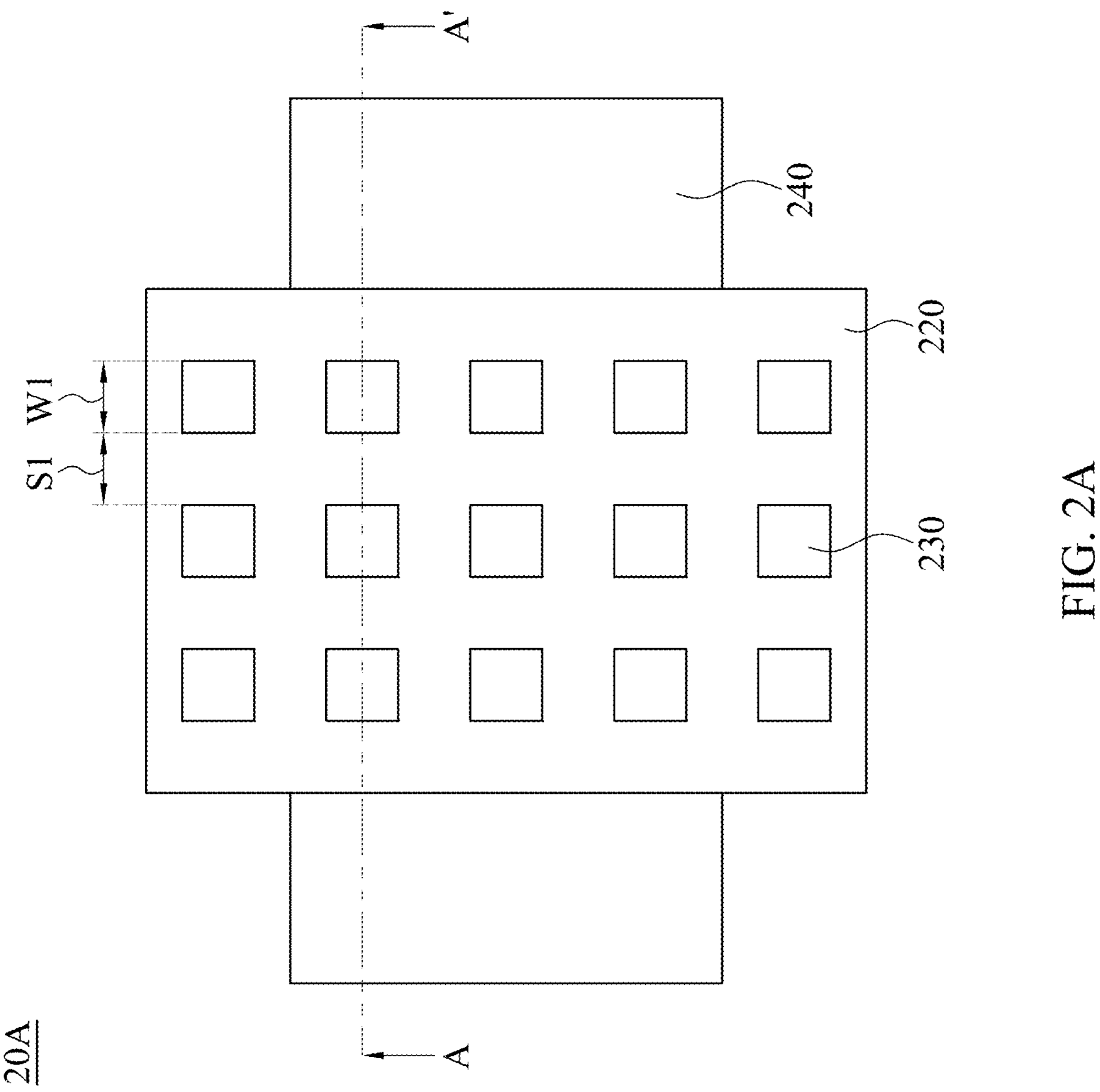
FIG. 2A illustrates a top view of a semiconductor device, in accordance with some embodiments of the present disclosure.

FIG. 2A illustrates a top view of a semiconductor device 20A, in accordance with some embodiments of the present disclosure. The semiconductor device 20A of FIG. 2A may be similar to the semiconductor device 10B of FIG. 1B, except for the differences described as follows. Note that some elements may be omitted from the layout of FIG. 2A for simplicity and clarity.

As shown in FIG. 2A, the layout of the semiconductor device 20A may include the metal structure 220, the supporting structures 230 and the insulating structure 240. In some embodiments, the supporting structures 230 may be formed within the metal structure 220. The supporting structures 230 may be encircled or compassed by the metal structure 220.

The supporting structures 230 may include, for example, silicon oxide ($SiO_2$), silicon nitride ($Si_3N_4$), silicon oxynitride, silicon nitride oxide, a high-k material or combinations thereof. In some embodiments, the supporting structures 230 may include at least one metallic element, such as hafnium oxide ($HfO_2$), silicon doped hafnium oxide (HSO), lanthanum oxide ($La_2O_3$), lanthanum aluminum oxide ($LaAlO_3$), zirconium oxide ($ZrO_2$), zirconium orthosilicate ($ZrSiO_4$), aluminum oxide ($Al_2O_3$) or combinations thereof.

In some embodiments, each of the supporting structures 230 may have a width W1. Each of the supporting structures 230 may be separated or spaced apart by a distance S1. In some embodiments, the width W1 may be in a range of 10 nm to 500 nm, preferably in the range of 100 nm to 200 nm. The distance S1 may be in a range of 10 nm to 500 nm, preferably in the range of 100 nm to 200 nm.

In some embodiments, each of the supporting structures 230 may include a cube pillar. In some embodiments, some of the supporting structures 230 may include a cube pillar. In some embodiments, each of the supporting structures 230 may include a cylindrical pillar. In some embodiments, some of the supporting structures 230 may include a cylindrical pillar. In some embodiments, each of the supporting structures 230 may include a square column. In some embodiments, some of the supporting structures 230 may include a square column. In some embodiments, each of the supporting structures 230 may include a cuboid shape. In some embodiments, some of the supporting structures 230 may include a cuboid shape.

Figure 2B:
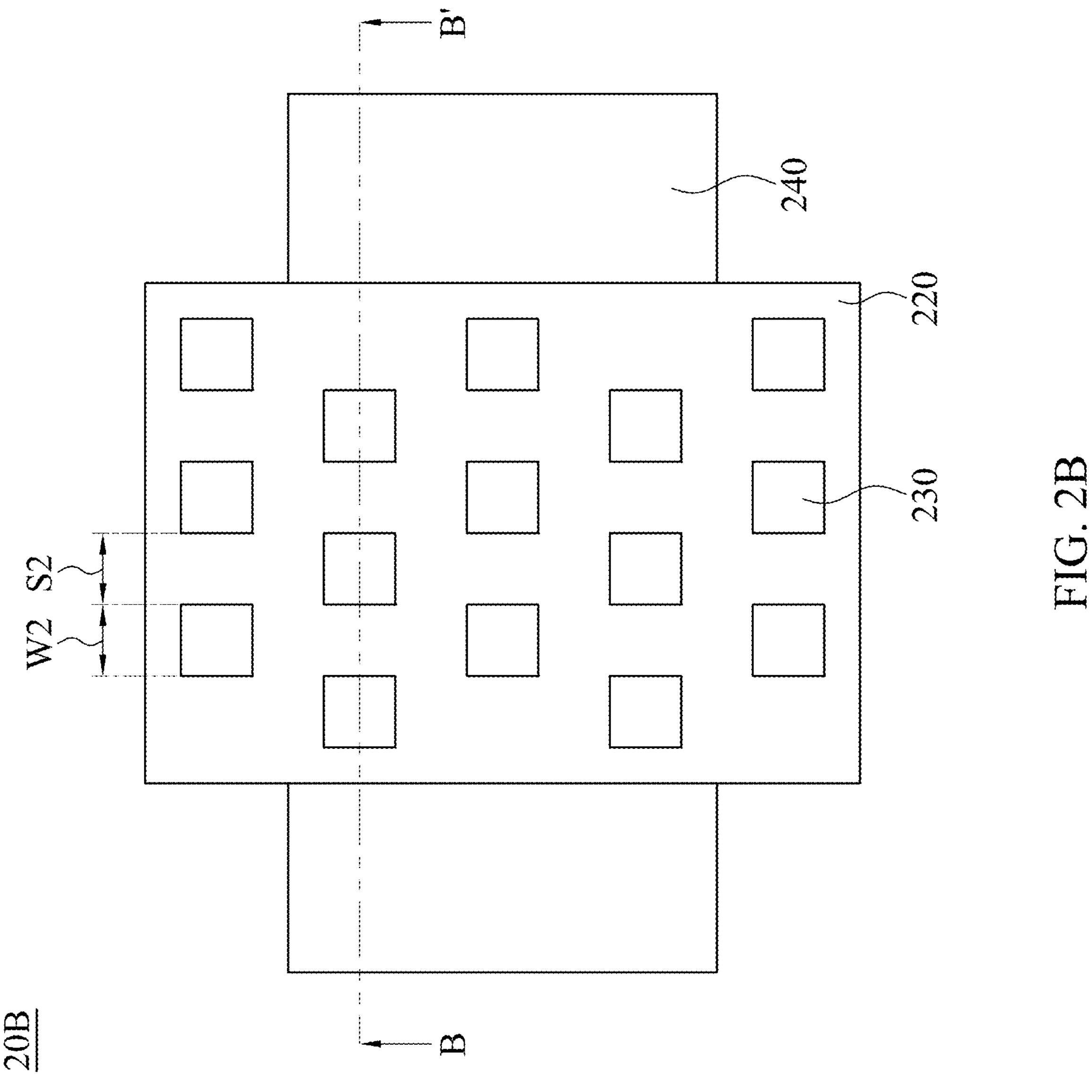
FIG. 2B illustrates another top view of a semiconductor device, in accordance with some embodiments of the present disclosure.

FIG. 2B illustrates another top view of a semiconductor device 20B, in accordance with some embodiments of the present disclosure. The semiconductor device 20B of FIG. 2B may be similar to the semiconductor device 20A of FIG. 2A, except for the differences described as follows. Note that some elements may be omitted from the layout in FIG. 2B for simplicity and clarity.

As shown in FIG. 2B, the layout of the semiconductor device 20B may include the metal structure 220, the supporting structures 230 and the insulating structure 240. In some embodiments, the supporting structures 230 may be formed within the metal structure 220. The supporting structures 230 may be encircled or compassed by the metal structure 220. In some embodiments, each of the supporting structures 230 may be alternated or intersected with each other.

In some embodiments, each of the supporting structures 230 may have a width W2. Each of the supporting structures 230 may be separated or spaced apart by a distance S2. In some embodiments, the width W2 may be in a range of 10 nm to 500 nm, preferably in the range of 100 nm to 200 nm. The distance S2 may be in a range of 10 nm to 500 nm, preferably in the range of 100 nm to 200 nm.

Figure 3A:
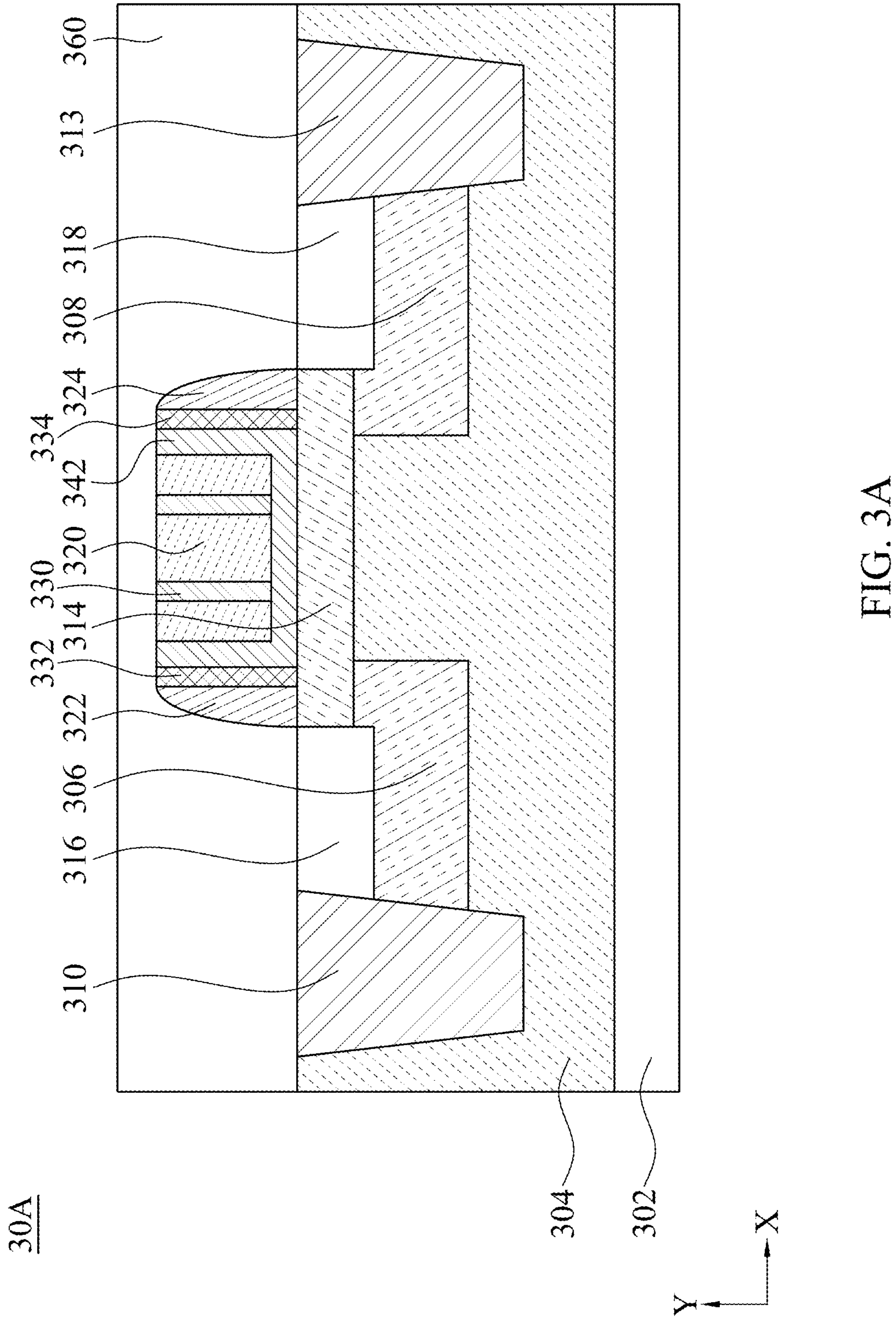
FIG. 3A illustrates a cross-section view of a semiconductor device along the section line A-A' in FIG. 2A, in accordance with some embodiments of the present disclosure.

FIG. 3A illustrates a cross-section view of a semiconductor device 30A along the section line A-A' in FIG. 2A, in accordance with some embodiments of the present disclosure. The semiconductor device 30A may include a substrate 302, a doped region 304, lightly doped regions 306 and 308, isolation regions 310 and 313, an insulating structure 314, source/drain regions 316 and 318, a metal structure 320, dielectric spacers 322 and 324, one or more supporting structures 330, conductive spacers 332 and 334, a dielectric structure 342, and a passivation layer 360. The supporting structures 330 may be formed on the dielectric structure 342. The bottom surfaces of the supporting structures 330 may be in direct contact with the upper surface of the dielectric structure 342.

In some embodiments, each of the supporting structures 330 may be spaced apart from each other. The lateral surfaces of the supporting structures 330 may be in direct contact with the metal structure 320. The supporting structures 330 may be spaced apart or separated with the lateral surface of the dielectric structure 342.

In some embodiments, the supporting structures 330 may extend along Y axis (first direction). The insulating structure 314 may extend along X axis (second direction). The first direction is perpendicular to the second direction. In some embodiments, the bottom portion of the dielectric structure 342 may extend along X axis. The side portion of the dielectric structure 342 may extend along Y axis.

The supporting structures 330 may include, for example, silicon oxide ($SiO_2$), silicon nitride ($Si_3N_4$), silicon oxynitride, silicon nitride oxide, a high-k material or combinations thereof. In some embodiments, the supporting structures 230 may include at least one metallic element, such as hafnium oxide ($HfO_2$), silicon doped hafnium oxide (HSO), lanthanum oxide ($La_2O_3$), lanthanum aluminum oxide ($LaAlO_3$), zirconium oxide ($ZrO_2$), zirconium orthosilicate ($ZrSiO_4$), aluminum oxide ($Al_2O_3$) or combinations thereof.

Figure 3B:
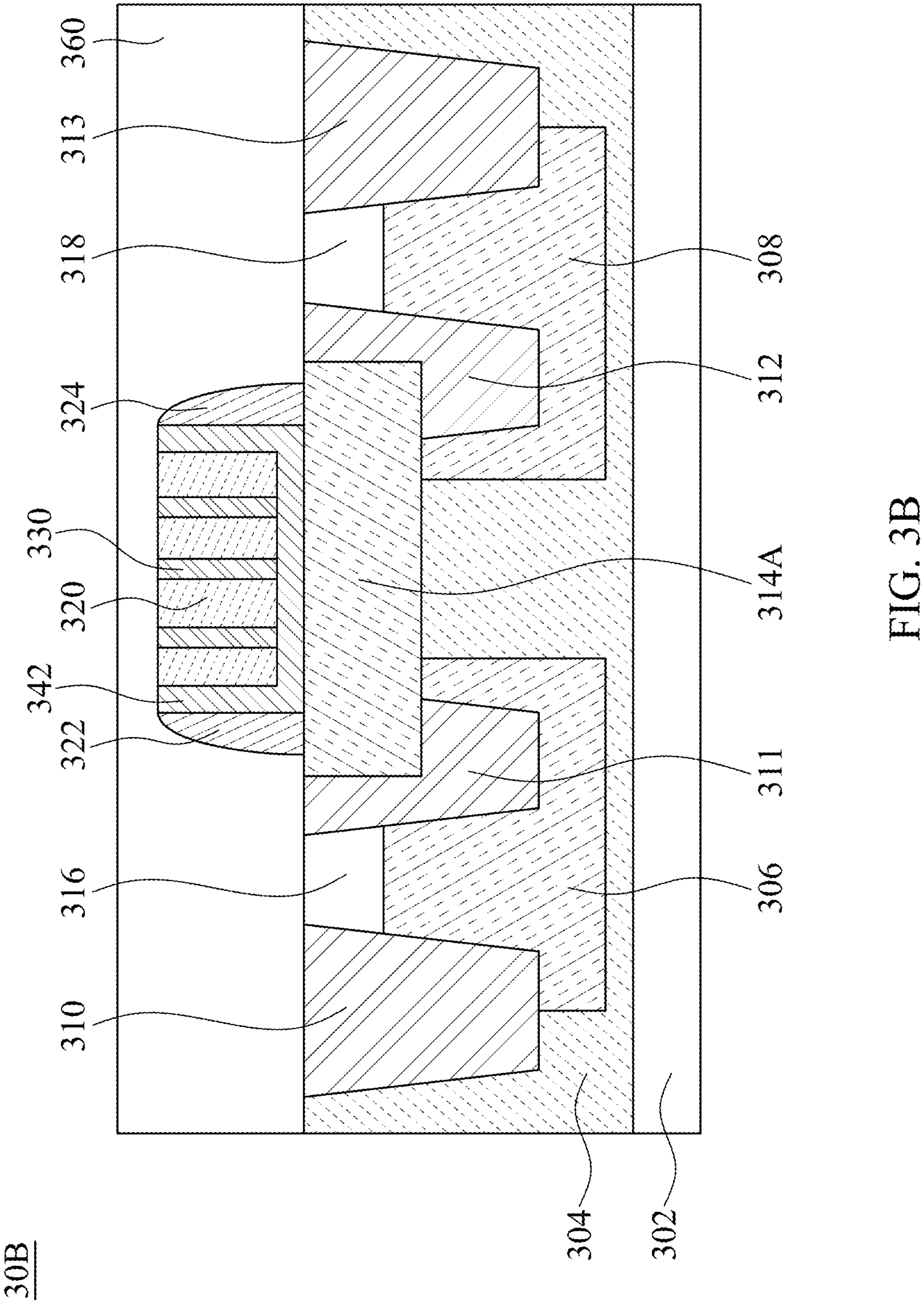
FIG. 3B illustrates a cross-section view of a semiconductor device along the section line B-B' in FIG. 2B, in accordance with some embodiments of the present disclosure.

FIG. 3B illustrates a cross-section view of a semiconductor device 30B along the section line B-B' in FIG. 2B, in accordance with some embodiments of the present disclosure. The semiconductor device 30B may include one or more supporting structures 330. The supporting structures 330 may be staggered with each other. The supporting structures 330 may be formed on the dielectric structure 342. The bottom surfaces of the supporting structures 330 may be in direct contact with the upper surface of the dielectric structure 342. In FIG. 3B, a portion of the insulating structure 314A may be compassed or surrounded by the isolation regions 311 and 312. A portion of the top surface of the insulating structure 314A may be uncovered by the dielectric spacers 322 and 324. In some embodiments, the source/drain region 316 may be formed between isolation regions 310 and 311, and the source/drain region 318 may be formed between isolation regions 312 and 313.

In some embodiments, each of the supporting structures 330 may be spaced apart from each other. The lateral surfaces of the supporting structures 330 may be in direct contact with the metal structure 320. The supporting structures 330 may be spaced apart or separated with the lateral surface of the dielectric structure 342.

The supporting structures 330 may be used to enhance the supporting or maintaining force during the manufacturing process of the semiconductor device 30B, especially the polishing or planarization process, such as the chemical-mechanical planarization (CMP) process. In some embodiments, the planar zed surface may be more smooth and uniform. Therefore, the reliability of the semiconductor device could be improved. In addition, the leakage current could be suppressed.

Figure 4:
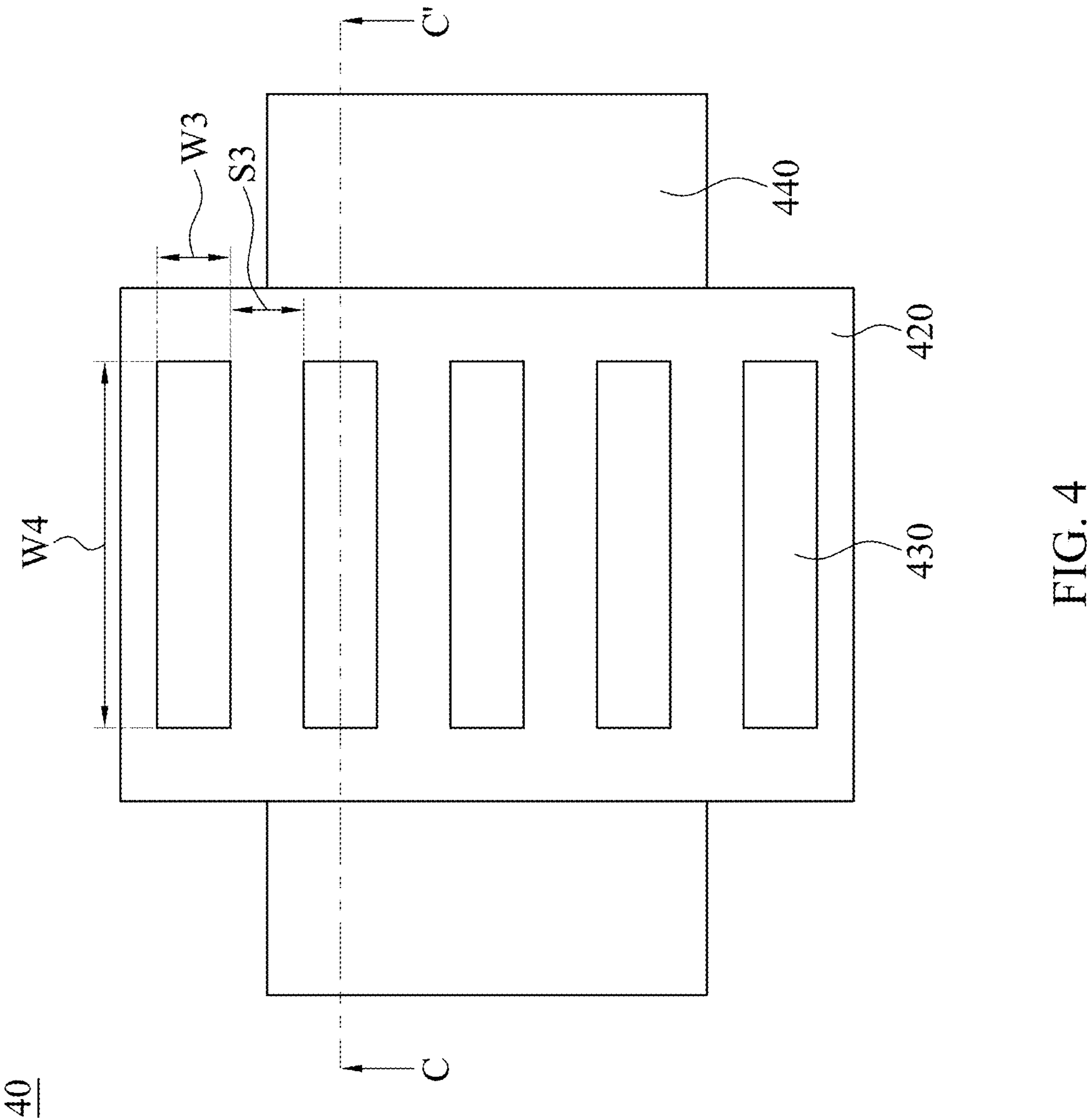
FIG. 4 illustrates a top view of a semiconductor device, in accordance with some embodiments of the present disclosure.

FIG. 4 illustrates a top view of a semiconductor device 40, in accordance with some embodiments of the present disclosure. The semiconductor device 40 of FIG. 4 may be similar to the semiconductor device 20A of FIG. 2A, except for the differences described as follows. Note that some elements may be omitted from the layout of FIG. 4 for simplicity and clarity.

As shown in FIG. 4, the layout of the semiconductor device 40 may include the metal structure 420, the supporting structures 430 and the insulating structure 440. In some embodiments, the supporting structures 430 may be formed within the metal structure 420. The supporting structures 430 may be encircled or compassed by the metal structure 420. Each of the supporting structures 430 may be in a shape of strip or plate.

In some embodiments, each of the supporting structures 430 may have a width W3. Each of the supporting structures 430 may have a length W4. Each of the supporting structures 430 may be separated or spaced apart by a distance S3. In some embodiments, the width W3 may be in a range of 10 nm to 500 nm, preferably in the range of 100 nm to 200 nm. The length W4 may be in a range of 10 nm to 1500 nm, preferably in the range of 200 nm to 800 nm. The distance S3 may be in a range of 10 nm to 500 nm, preferably in the range of 100 nm to 200 nm.

Figure 5A:
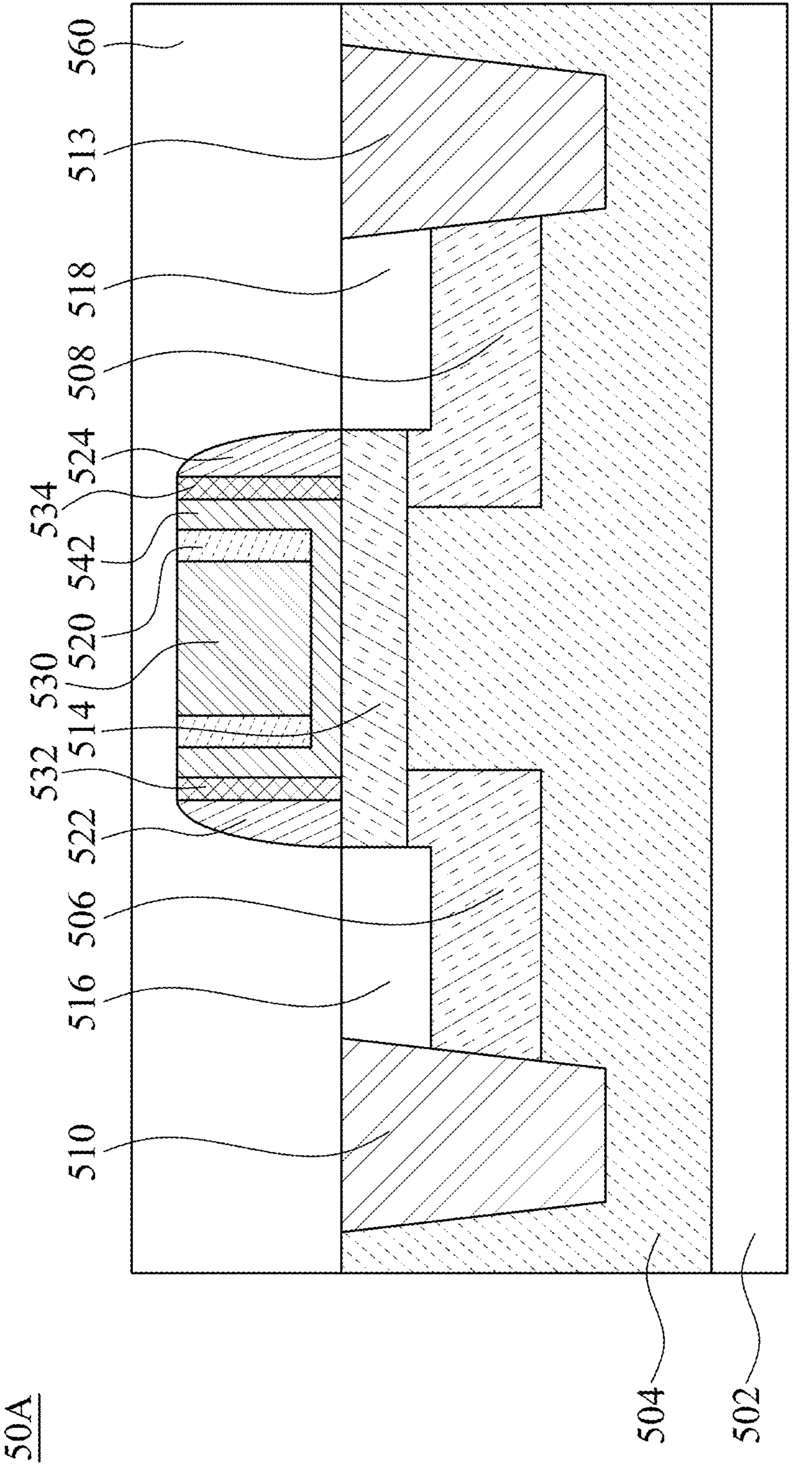
FIG. 5A illustrates a cross-section view of a semiconductor device along the section line C-C' in FIG. 4, in accordance with some embodiments of the present disclosure.

FIG. 5A illustrates a cross-section view of a semiconductor device 50A along the section line C-C' in FIG. 4, in accordance with some embodiments of the present disclosure. The semiconductor device 50A may include a substrate 502, a doped region 504, lightly doped regions 506 and 508, isolation regions 510 and 513, an insulating structure 514, source/drain regions 516 and 518, a metal structure 520, dielectric spacers 522 and 524, one or more supporting structures 530, conductive spacers 532 and 534, a dielectric structure 542, and a passivation layer 560. The supporting structures 530 may be formed on the dielectric structure 542. The bottom surfaces of the supporting structures 530 may be in direct contact with the upper surface of the dielectric structure 542. The lateral surfaces of the supporting structures 530 may be in direct contact with the metal structure 320. The supporting structures 530 may be spaced apart or separated with the lateral surface of the dielectric structure 542.

Figure 5B:
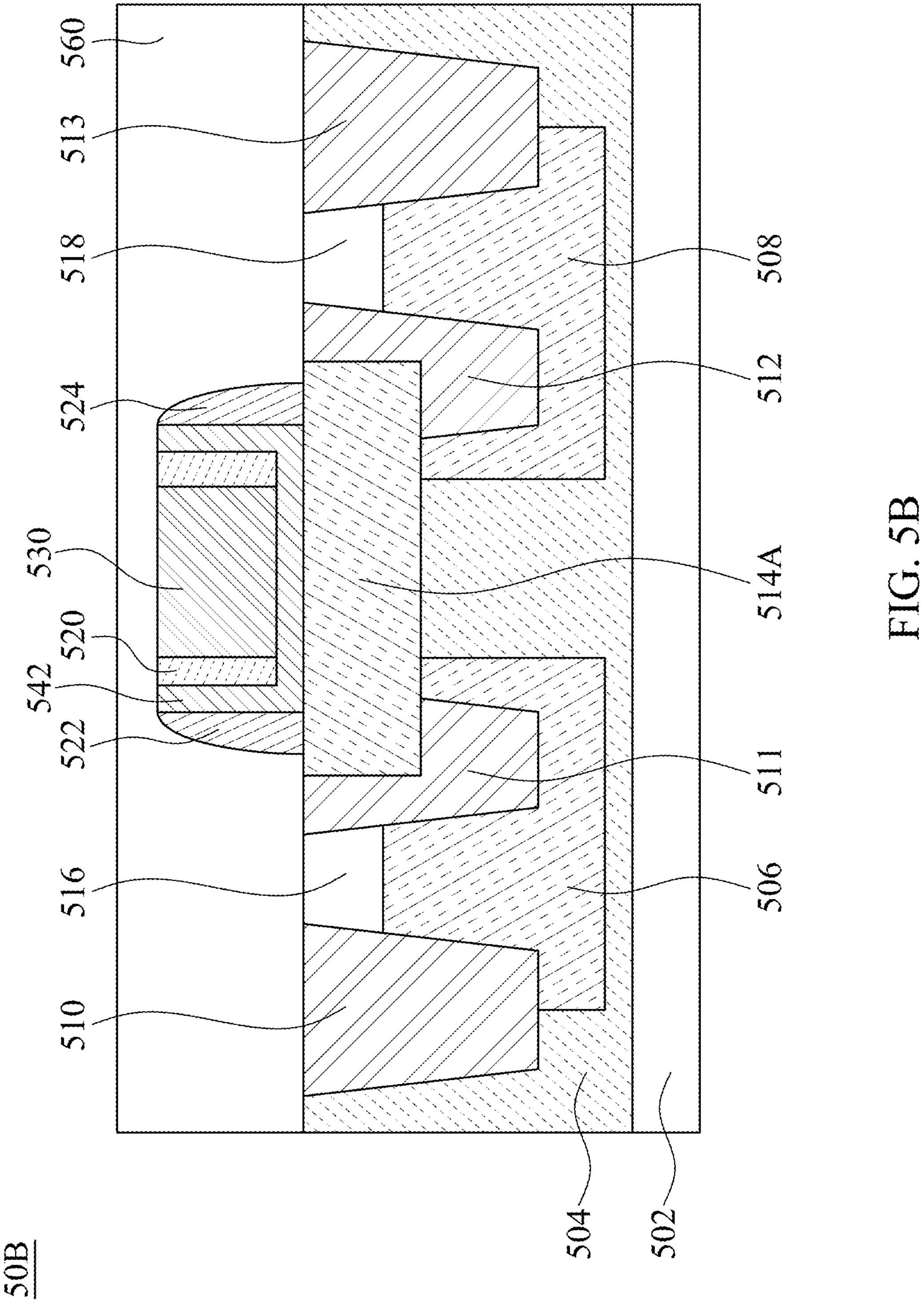
FIG. 5B illustrates another cross-section view of a semiconductor device along the section line C-C' in FIG. 4, in accordance with some embodiments of the present disclosure.

FIG. 5B illustrates another cross-section view of a semiconductor device 50B along the section line C-C' in FIG. 4, in accordance with some embodiments of the present disclosure. The semiconductor device 50B of FIG. 5B may be similar to the semiconductor device 50A of FIG. 5A, except for the differences described as follows.

In some embodiments, the area/volume of the insulating structure 514A may be greater than that of the insulating structure 514 of the semiconductor device 50A of FIG. 5A. A portion of the insulating structure 514A may be compassed or surrounded by the isolation regions 511 and 512. A portion of the top surface of the insulating structure 514A may be uncovered by the dielectric spacers 522 and 524.

In some embodiments, the source/drain region 516 may be formed between isolation regions 510 and 511. The lateral surfaces of the source/drain region 516 may contact portions of the lateral surfaces of the isolation regions 510 and 511. In some embodiments, the source/drain region 518 may be formed between isolation regions 512 and 513. The lateral surfaces of the source/drain region 518 may contact portions of the lateral surfaces of the isolation regions 512 and 513.

By forming or utilizing the supporting structure 530 proposed by the present disclosure, the supporting or maintaining force may be increased during the manufacturing process of the semiconductor device, such as the CMP process. Consequently, the planar zed surface may be more smooth and uniform. As a result, the reliability and performance of the semiconductor device could be improved.

Figure 6A:
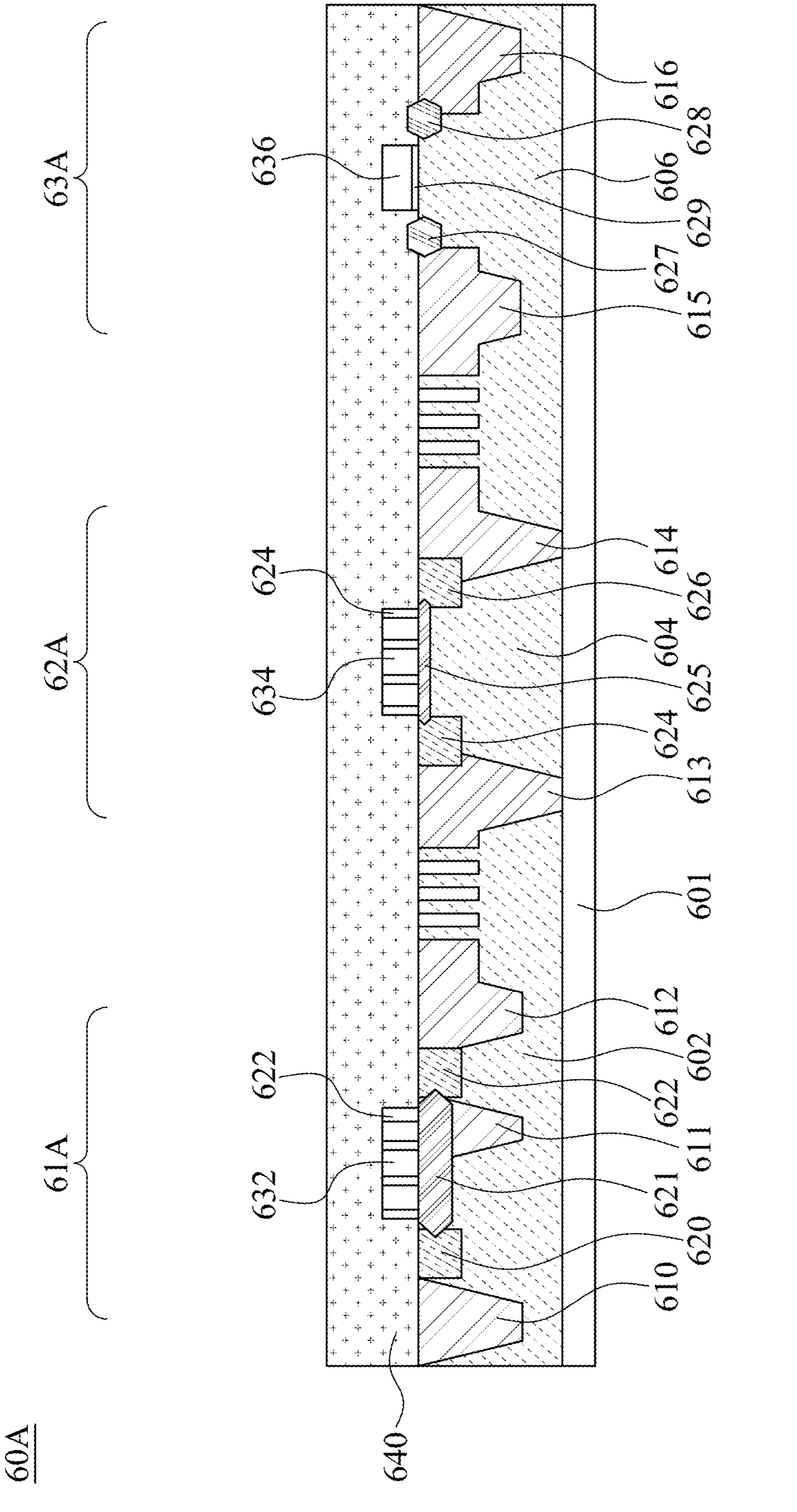
FIG. 6A is a schematic view illustrating a cross-section of a semiconductor device, in accordance with some embodiments of the present disclosure.

FIG. 6A is a schematic view illustrating a cross-section of a semiconductor device 60A, in accordance with some embodiments of the present disclosure. The semiconductor device 60A may include a semiconductor device 61A, a semiconductor device 62A and a semiconductor device 63A. The semiconductor device 61A may be used for HV applications. The semiconductor device 62A may be used for MV applications. The semiconductor device 63A may be used for LV applications.

In some embodiments, the semiconductor device 61A may include the substrate 601, the doped region 602, the isolation regions 610, 611, and 612, the source/drain regions 620 and 622, the insulating structure 621, the poly structure 632, and the dielectric spacer 622. The dielectric spacer 622 and the poly structure 632 may be formed on the insulating structure 621. The dielectric spacer 622 and the poly structure 632 may be covered by the passivation layer 640. The passivation layer 640 may include an oxide interlayer dielectric (ILD).

In some embodiments, the semiconductor device 62A may include the substrate 601, the doped region 604, the isolation regions 613 and 614, the source/drain regions 624 and 626, the insulating structure 625, the poly structure 634, and the dielectric spacer 624. The dielectric spacer 624 and the poly structure 634 may be formed on the insulating structure 625. The dielectric spacer 624 and the poly structure 634 may be covered by the passivation layer 640.

In some embodiments, the semiconductor device 63A may include the substrate 601, the doped region 606, the isolation regions 615 and 616, the lightly doped regions 627 and 628, the insulating structure 629, and the poly structure 636. The poly structure 636 may be formed on the insulating structure 629. The poly structure 636 may be covered by the passivation layer 640.

Figure 6B:
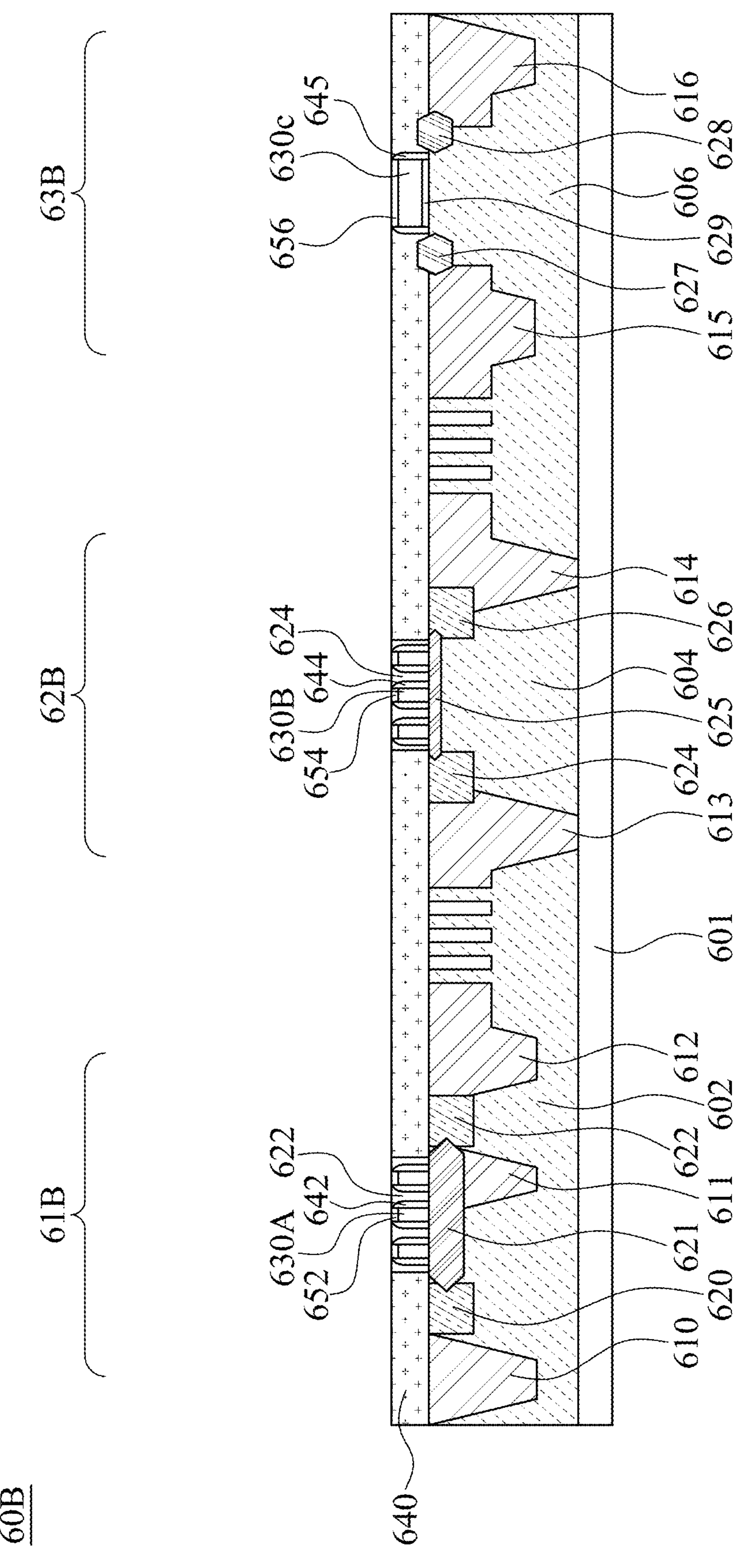
FIG. 6B is another schematic view illustrating a cross-section of a semiconductor device, in accordance with some embodiments of the present disclosure.

FIG. 6B is another schematic view illustrating a cross-section of a semiconductor device 60B, in accordance with some embodiments of the present disclosure. The semiconductor device 60B may be formed after the semiconductor device 60A of FIG. 6A. The semiconductor device 60B may be formed after a chemical-mechanical planarization (CMP) is performed on the semiconductor device 60A of FIG. 6A. After the planarization, the thickness of the passivation layer 640 in FIG. 6B is smaller than that of FIG. 6A.

In some embodiments, the semiconductor device 61B may include the substrate 601, the doped region 602, the isolation regions 610, 611, and 612, the source/drain regions 620 and 622, the insulating structure 621, the dielectric spacer 622, the metal structure 630A, the dielectric structure 642 and the capping layer 652. The configuration of the semiconductor device 61B, particularly the dielectric spacer 622, the metal structure 630A, the dielectric structure 642, may correspond to the semiconductor device 10D of FIG. 1E. The dielectric structure 642 may be formed by partially removing the poly structure 632. The dielectric structure 642 may be formed by removing a portion of the poly structure 632.

In some embodiments, the semiconductor device 62B may include the substrate 601, the doped region 602, the isolation regions 610, 611, and 612, the source/drain regions 620 and 622, the insulating structure 621, the dielectric spacer 624, the metal structure 630B, the dielectric structure 644 and the capping layer 654. The configuration of the semiconductor device 62B, particularly the dielectric spacer 624, the metal structure 630B, the dielectric structure 644, may correspond to the semiconductor device 10A of FIG. 1B.

In some embodiments, the semiconductor device 63B may include the substrate 601, the doped region 602, the isolation regions 610, 611, and 612, the source/drain regions 620 and 622, the insulating structure 621, the metal structure 630C, the dielectric structure 645 and the capping layer 656. The configuration of the semiconductor device 63B, particularly the metal structure 630C and the dielectric structure 645, may correspond to the semiconductor device 10C of FIG. 1D.

Figure 6C:
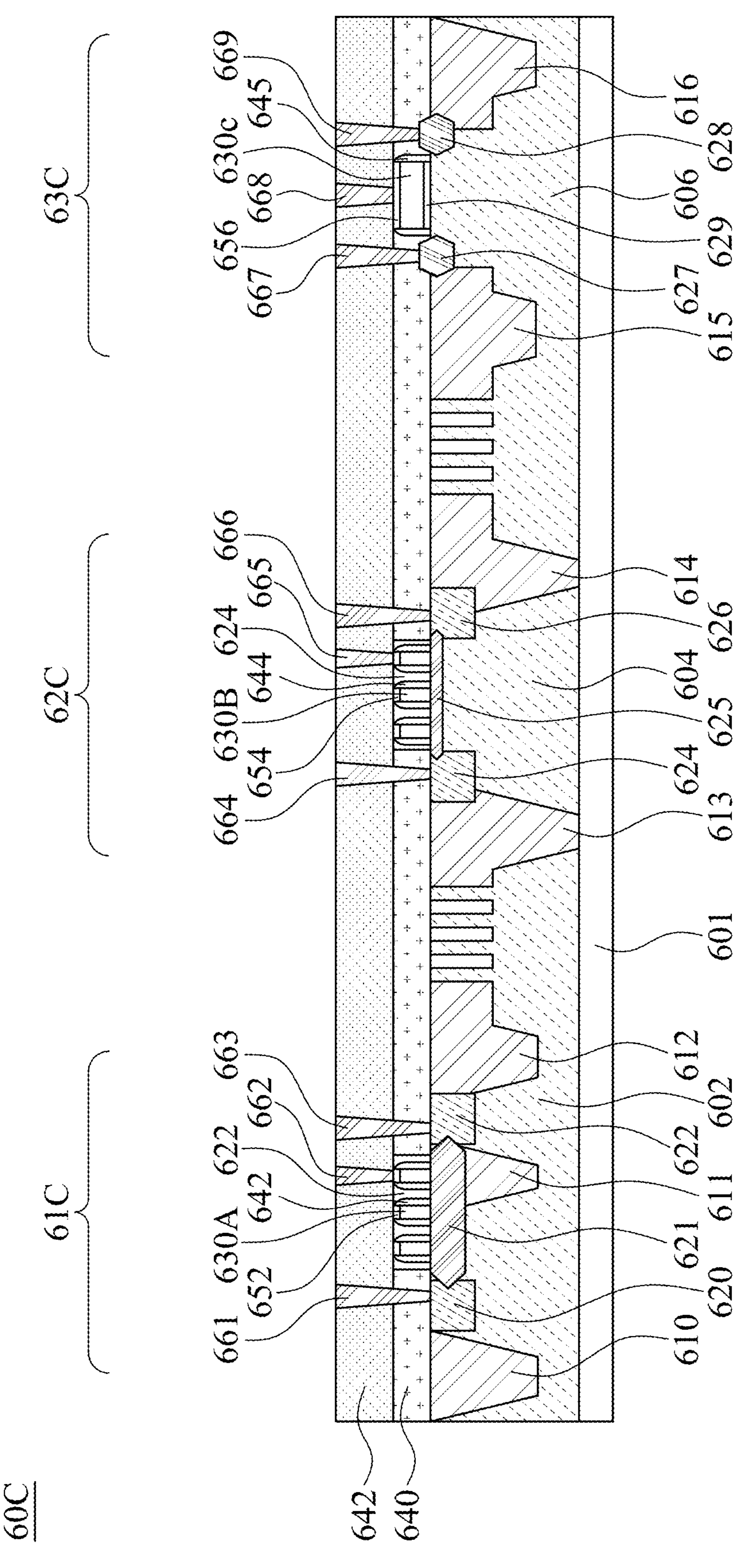
FIG. 6C is another schematic view illustrating a cross-section of a semiconductor device, in accordance with some embodiments of the present disclosure.

FIG. 6C is another schematic view illustrating a cross-section of a semiconductor device, in accordance with some embodiments of the present disclosure. The semiconductor device 60C may be formed after the semiconductor device 60B of FIG. 6B. The semiconductor device 60C may be formed after another CMP is performed on the semiconductor device 60B of FIG. 6B. After the planarization, the thickness of the passivation layer 640 in FIG. 6C is smaller than that of FIG. 6B.

In addition, the passivation layer 640 may be formed on the passivation layer 640. The passivation layer 640 may include an oxide interlayer dielectric (ILD). The passivation layer 640 may be substantially identical to the passivation layer 640. The passivation layer 640 may be different from the passivation layer 640.

In some embodiments, the semiconductor device 61C may include the substrate 601, the doped region 602, the isolation regions 610, 611, and 612, the source/drain regions 620 and 622, the insulating structure 621, the dielectric spacer 622, the metal structure 630A, the dielectric structure 642, the capping layer 652, and the conductive structures 661, 662 and 663. The configuration of the semiconductor device 61C, particularly the dielectric spacer 622, the metal structure 630A, the dielectric structure 642, may correspond to the semiconductor device 10D of FIG. 1E.

In some embodiments, the semiconductor device 62C may include the substrate 601, the doped region 602, the isolation regions 610, 611, and 612, the source/drain regions 620 and 622, the insulating structure 621, the dielectric spacer 624, the metal structure 630B, the dielectric structure 644, the capping layer 654, and the conductive structures 664, 665 and 666. The configuration of the semiconductor device 62C, particularly the dielectric spacer 624, the metal structure 630B, the dielectric structure 644, may correspond to the semiconductor device 10A of FIG. 1B.

In some embodiments, the semiconductor device 63C may include the substrate 601, the doped region 602, the isolation regions 610, 611, and 612, the source/drain regions 620 and 622, the insulating structure 621, the metal structure 630C, the dielectric structure 645, the capping layer 656, and the conductive structures 667, 668 and 669. The configuration of the semiconductor device 63C, particularly the metal structure 630C and the dielectric structure 645, may correspond to the semiconductor device 10C of FIG. 1D. Therefore, the processing integration could be achieved to provide the semiconductor device 61C for HV applications, the semiconductor device 62C for MV applications, and the semiconductor device 63C for LV applications.

Figure 7:
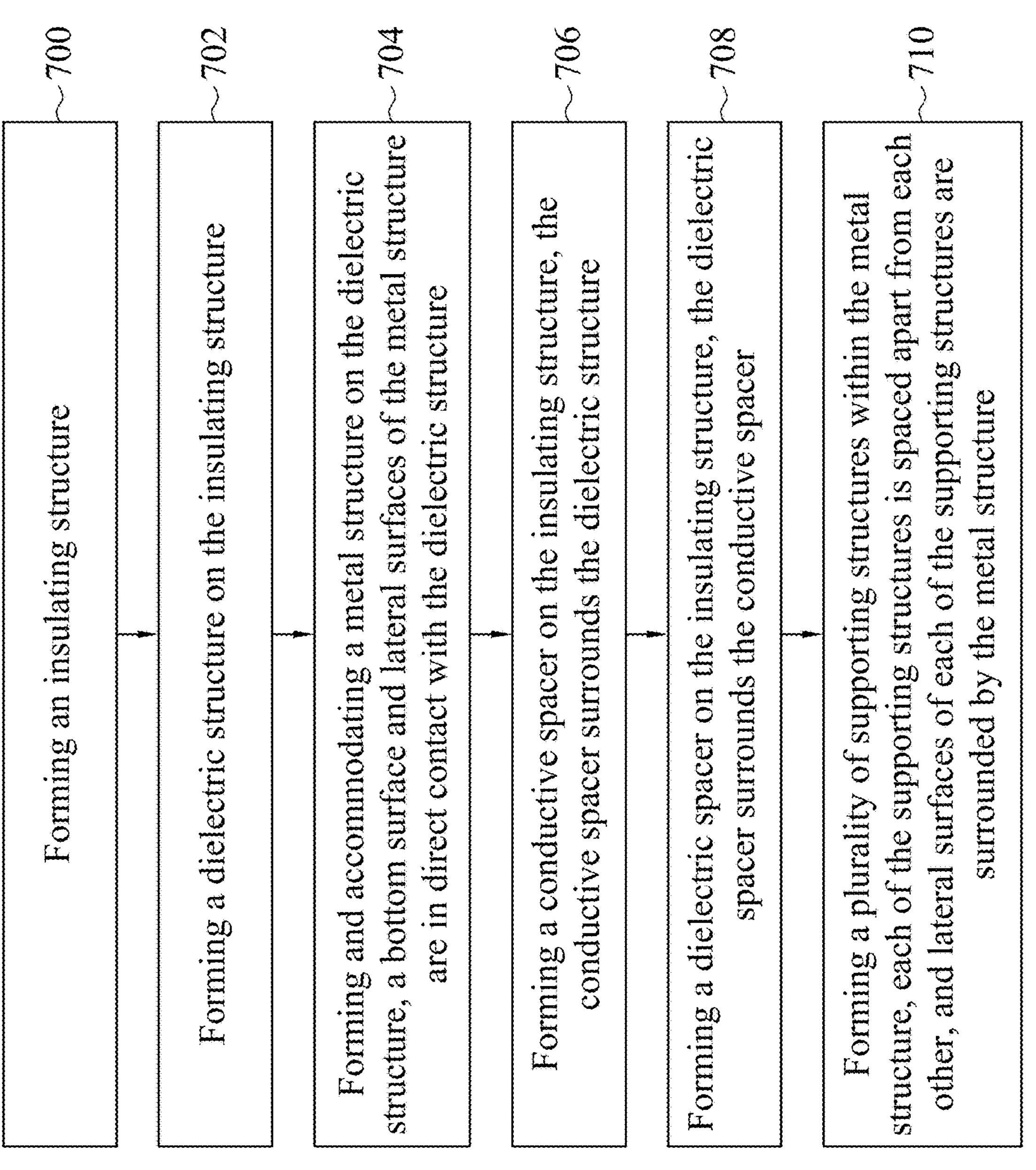
FIG. 7 illustrates a flow chart including operations for manufacturing a semiconductor device, in accordance with some embodiments of the present disclosure.

FIG. 7 illustrates a flow chart including operations for manufacturing a semiconductor device, in accordance with some embodiments of the present disclosure. In operation 700, an insulating structure is formed. In operation 702, a dielectric structure is formed on the insulating structure.

Furthermore, in operation 704, a metal structure is formed on and accommodated by the dielectric structure. The bottom surface and lateral surfaces of the metal structure are in direct contact with the dielectric structure. In operation 706, a conductive spacer is formed on the insulating structure, and the conductive spacer surrounds the dielectric structure. In operation 708, a dielectric spacer is formed on the insulating structure, and the dielectric spacer surrounds the conductive spacer. In operation 710, a plurality of supporting structures are formed within the metal structure. Each of the supporting structures is spaced apart from each other, and lateral surfaces of each of the supporting structures are surrounded by the metal structure.

It should be noted that some operations may occur in different order and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

Some embodiments of the present disclosure provide a semiconductor device. The semiconductor device includes an insulating structure, a dielectric structure, a metal structure, a conductive spacer and a dielectric spacer. The dielectric structure is formed on the insulating structure. The metal structure is formed on and surrounded by the dielectric structure. A bottom surface and a lateral surface of the metal structure are in direct contact with the dielectric structure. The conductive spacer is formed on the insulating structure. The conductive spacer surrounds the dielectric structure. The dielectric spacer is formed on the insulating structure, wherein the dielectric spacer surrounds the conductive spacer.

Some embodiments of the present disclosure provide a semiconductor device. The semiconductor device includes an insulating structure, a dielectric structure, a metal structure, and a plurality of supporting structures. The dielectric structure is formed on the insulating structure. The metal structure is formed on and accommodated by the dielectric structure. The supporting structures are formed within the metal structure. Each of the supporting structures is spaced apart from each other and surrounded by the metal structure.

Some embodiments of the present disclosure provide a method for manufacturing a semiconductor device. The method includes forming an insulating structure; forming a dielectric structure on the insulating structure; forming a metal structure surrounded by the dielectric structure, wherein a bottom surface and a lateral surface of the metal structure are in direct contact with the dielectric structure; forming a conductive spacer on the insulating structure, wherein the conductive spacer surrounds the dielectric structure; and forming a dielectric spacer on the insulating structure, wherein the dielectric spacer surrounds the conductive spacer.

The foregoing outlines structures of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:

an insulating structure;

a high-K dielectric structure formed on the insulating structure;

a metal structure formed on and surrounded by the high-K dielectric structure, wherein a bottom surface and a lateral surface of the metal structure are in direct contact with the high-K dielectric structure;

a conductive spacer formed on the insulating structure, wherein the conductive spacer surrounds the high-K dielectric structure;

a dielectric spacer formed on the insulating structure, wherein the dielectric spacer surrounds the conductive spacer; and supporting structures formed within the metal structure, wherein the high-K dielectric structure encloses the metal structure and the supporting structures, wherein a top surface of the insulating structure is coplanar with top surfaces of a source electrode and a drain electrode that are on opposite sides of the insulating structure, and portions of lateral surfaces of the source electrode and the drain electrode cover opposite sidewalls of the insulating structure, and a doped region covers remaining portions of the lateral surfaces of the source electrode and the drain electrode.

2. The semiconductor device of claim 1, wherein a dielectric constant of the high-K dielectric structure is greater than that of the dielectric spacer.

3. The semiconductor device of claim 1, wherein the conductive spacer is in direct contact with a lateral surface of the high-K dielectric structure, and the dielectric spacer is in direct contact with a lateral surface of the conductive spacer.

4. The semiconductor device of claim 1, wherein the metal structure includes a gate electrode of the semiconductor device, and the insulating structure is formed between the drain electrode and the source electrode of the semiconductor device.

5. The semiconductor device of claim 1, wherein a top surface of the metal structure is coplanar with those of the high-K dielectric structure and the conductive spacer.

6. The semiconductor device of claim 1, wherein the supporting structures are embedded within the metal structure.

7. The semiconductor device of claim 6, wherein the supporting structures are spaced apart from each other.

8. The semiconductor device of claim 6, wherein bottom surfaces of the supporting structures are in direct contact with an upper surface of the high-K dielectric structure.

9. A semiconductor device, comprising:

an insulating structure;

a dielectric structure formed on the insulating structure;

a metal structure formed on and surrounded by the dielectric structure; and a plurality of supporting structures formed within the metal structure, wherein each of the supporting structures is spaced apart from each other and surrounded by the metal structure, wherein a top surface of the insulating structure is coplanar with top surfaces of a source electrode and a drain electrode that are on opposite sides of the insulating structure, and portions of lateral surfaces of the source electrode and the drain electrode cover opposite sidewalls of the insulating structure, and a doped region covers remaining portions of the lateral surfaces of the source electrode and the drain electrode.

10. The semiconductor device of claim 9, wherein the supporting structures extend along a first direction, the insulating structure extends along a second direction, and the first direction is perpendicular to the second direction.

11. The semiconductor device of claim 9, wherein each of the supporting structures includes a square column.

12. The semiconductor device of claim 9, wherein each of the supporting structures is staggered with each other.

13. The semiconductor device of claim 9, further comprising:

a conductive spacer formed on the insulating structure, wherein the conductive spacer is in direct contact with a lateral surface of the dielectric structure.

14. The semiconductor device of claim 13, further comprising:

a dielectric spacer formed on the insulating structure, wherein the dielectric spacer is in direct contact with a lateral surface of the conductive spacer.

15. The semiconductor device of claim 14, wherein a dielectric constant of the dielectric structure is greater than that of the dielectric spacer.

16. The semiconductor device of claim 9, wherein the metal structure includes a gate electrode of the semiconductor device, and the insulating structure is formed between the drain electrode and the source electrode of the semiconductor device.

17. A semiconductor device, comprising:

an insulating structure;

a dielectric structure comprising a high-K dielectric material and formed on the insulating structure;

a metal structure formed on and surrounded by the dielectric structure, wherein the metal structure is separated from the insulating structure by the dielectric structure;

a dielectric spacer formed on the insulating structure and in contact with the insulating structure; and supporting structures formed within the metal structure, wherein side portions of the dielectric structure are formed between the dielectric spacer and the metal structure, wherein a top surface of the insulating structure is coplanar with top surfaces of a source electrode and a drain electrode that are on opposite sides of the insulating structure, and portions of lateral surfaces of the source electrode and the drain electrode cover opposite sidewalls of the insulating structure, and a doped region covers remaining portions of the lateral surfaces of the source electrode and the drain electrode.

18. The semiconductor device of claim 17, further comprising:

a conductive spacer formed on the insulating structure, wherein the conductive spacer surrounds the dielectric structure and is in direct contact with the side portions of the dielectric structure.

19. The semiconductor device of claim 18, wherein the dielectric spacer surrounds the conductive spacer.

20. The semiconductor device of claim 17, wherein a bottom surface and lateral surfaces of the metal structure are in direct contact with the dielectric structure.

* * * * *